United States Patent
Liu et al.

(10) Patent No.: US 10,222,896 B2
(45) Date of Patent: Mar. 5, 2019

(54) PIXEL STRUCTURE, TRANSPARENT TOUCH DISPLAY SCREEN AND MANUFACTURING METHOD THEREOF, AND DISPLAY DEVICE

(71) Applicant: BOE TECHNOLOGY GROUP CO., LTD., Beijing (CN)

(72) Inventors: Libin Liu, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 15/038,105

(22) PCT Filed: Oct. 20, 2015

(86) PCT No.: PCT/CN2015/092261
§ 371 (c)(1),
(2) Date: May 20, 2016

(87) PCT Pub. No.: WO2016/082636
PCT Pub. Date: Jun. 2, 2016

(65) Prior Publication Data
US 2017/0010734 A1   Jan. 12, 2017

(30) Foreign Application Priority Data
Nov. 28, 2014 (CN) .......................... 2014 1 0709212

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ............ H01L 27/3265; H01L 27/1255; H01L 27/3258; H01L 21/77; H01L 2227/323;
(Continued)

(56) References Cited

U.S. PATENT DOCUMENTS 5,908,540 A * 6/1999 Fanti ...................... C25D 17/12
204/242
8,686,407 B2 4/2014 Shu et al.
(Continued)

FOREIGN PATENT DOCUMENTS

CN       102738198 A    10/2012
CN       103247657 A     8/2013
(Continued)

OTHER PUBLICATIONS

International Search Report dated Jan. 25, 2016 corresponding to International application No. PCT/CN2015/092261.
(Continued)

*Primary Examiner* — Sanjiv D. Patel
(74) *Attorney, Agent, or Firm* — Nath, Goldberg & Meyer; Joshua B. Goldberg (57) ABSTRACT

The invention provides a pixel structure, a transparent touch display screen and a manufacturing method thereof, and a display device. The transparent touch display screen includes a plurality of rows and columns of pixel structures arranged in an array, and each pixel structure includes a display region provided with an organic electroluminescent device and a transparent region provided side by side with the display region. A first and a second touch capacitor electrodes made of a transparent conductive material are respectively provided in every two adjacent transparent regions in the same row, every two adjacent first touch capacitor electrodes in the same row are electrically connected with each other by a first connection line extending (Continued)

in the row direction, every two adjacent second touch capacitor electrodes in the same column are electrically connected with each other by a second connection line passing through the display region in the column direction.

19 Claims, 5 Drawing Sheets

(51) Int. Cl.
    *H01L 27/32*            (2006.01)
    *H01L 51/56*            (2006.01)

(52) U.S. Cl.
    CPC ............ *H01L 27/323* (2013.01); *H01L 51/56* (2013.01); *G06F 2203/04103* (2013.01); *G06F 2203/04111* (2013.01)

(58) Field of Classification Search
    CPC ............... H01L 27/323; H01L 27/3246; H01L 27/3276; H01L 51/56; H01L 2924/05442; H01L 29/861; H01L 51/5012; G06F 2203/04103; G06F 2203/04111; G06F 3/0412; G06F 3/0416; G06F 3/044; G09G 3/3648; G09G 2300/0426; G09G 2300/0439
    See application file for complete search history.

(56) References Cited

U.S. PATENT DOCUMENTS

| | | | | |
|---|---|---|---|---|
| 8,901,549 | B2* | 12/2014 | Huang | G06F 3/041 178/17 D |
| 9,495,031 | B2 | 11/2016 | Omoto | |
| 2003/0141811 | A1* | 7/2003 | Park | H01L 27/3265 313/506 |
| 2010/0244661 | A1* | 9/2010 | Li | H01J 1/74 313/494 |
| 2012/0154320 | A1* | 6/2012 | Ma | G06F 3/0412 345/173 |
| 2014/0063368 | A1* | 3/2014 | Yamazaki | G02F 1/13338 349/12 |
| 2014/0110683 | A1* | 4/2014 | Huang | G06F 3/041 257/40 |
| 2014/0132553 | A1* | 5/2014 | Park | G06F 3/044 345/174 |
| 2014/0152910 | A1 | 6/2014 | Kang et al. | |
| 2015/0041778 | A1* | 2/2015 | Chang | H01L 27/3262 257/40 |
| 2015/0236304 | A1* | 8/2015 | Negishi | H01L 51/56 438/29 |
| 2015/0311477 | A1* | 10/2015 | Cho | H01L 51/5284 257/40 |

FOREIGN PATENT DOCUMENTS

| | | |
|---|---|---|
| CN | 103885625 A | 6/2014 |
| CN | 103887324 A | 6/2014 |
| CN | 104156100 A | 11/2014 |
| CN | 104393021 A | 3/2015 |
| CN | 204303812 U | 4/2015 |
| KR | 20140039470 A | 2/2014 |
| KR | 10-2014-0039470 A | 4/2014 |
| KR | 20140039470 A | 4/2014 |
| KR | 1020140039470 A | 4/2014 |
| WO | 2014024908 A1 | 2/2014 |

OTHER PUBLICATIONS

Notification of the First Office Action dated Sep. 28, 2016 corresponding to Chinese application No. 201410709212.7.
Written Opinion of the International Searching Authority dated Jan. 25, 2016 corresponding to International application No. PCT/CN2015/092261.
The Second Office Action dated Apr. 28, 2017 corresponding to Chinese application No. 201410709212.7.
Office Action dated Nov. 28, 2017 issued in corresponding Chinese Application No. 201410709212.7.
European Search report dated Jun. 7, 2018 from corresponding European Patent Search No. 15858104.1.

* cited by examiner

PIXEL STRUCTURE, TRANSPARENT TOUCH DISPLAY SCREEN AND MANUFACTURING METHOD THEREOF, AND DISPLAY DEVICE

This is a National Phase Application filed under 35 U.S.C. 371 as a national stage of PCT/CN2015/092261, filed Oct. 20, 2015, an application claiming the benefit of Chinese Application No. 201410709212.7, filed Nov. 28, 2014, the content of each of which is hereby incorporated by reference in its entirety.

FIELD OF THE INVENTION

The present invention relates to the field of display technology, and in particular, relates to a pixel structure, a transparent touch display screen and a manufacturing method thereof, and a display device including the transparent touch display screen.

BACKGROUND OF THE INVENTION

In the field of flat panel display, an organic electroluminescent device (OLED) is widely used in the flat panel display since its manufacturing apparatus is of low cost, its manufacturing procedure is simple, it is self-luminous and thus back light source elements can be reduced in amount, and further the thickness of the display panel can be decreased.

A touch screen display device is currently developed to integrate the touch screen with the organic electroluminescent device. However some touch screen display devices are still mainly formed by integrating the touch screen with the organic electroluminescent device by mechanical cooperation. The touch screen and the organic electroluminescent device are assembled together to form the touch screen display device, and although the advantages that the organic electroluminescent device is self-luminous and no back light source is required are used, and thus the formed touch screen display device is obviously reduced in thickness compared to the touch screen display device assembled with the conventional CRT, LCD and the like, the entire thickness of the formed touch screen display device is significantly increased compared to the organic electroluminescent display since a separate touch screen is added. In addition, for a transparent organic electroluminescent display, the addition of the entire thickness will reduce the transparency of the display device, resulting in a bad display effect.

SUMMARY OF THE INVENTION

Embodiments of the invention provide a pixel structure, a transparent touch display screen and a manufacturing method thereof, and a display device including the transparent touch display screen, which can maintain the transparency of the display screen while reducing the entire thickness of the display screen.

According to an embodiment in one aspect of the invention, a pixel structure is provided, and the pixel structure includes: a display region, including an organic electroluminescent device; and a transparent region, provided side by side with the display region, and provided with a touch capacitor electrode, which is made of a transparent conductive material.

In the pixel structure according to an embodiment of the invention, the touch capacitor electrode and a cathode of the organic electroluminescent device are provided in the same layer, disconnected with each other, and made of the same material.

In the pixel structure according to an embodiment of the invention, at least one insulation layer of a plurality of insulation layers under the cathode of the organic electroluminescent device forms a segment difference between the display region and the transparent region.

In the pixel structure according to an embodiment of the invention, the at least one insulation layer includes a passivation layer provided under the anode of the organic electroluminescent device, and a thickness of the passivation layer in the display region is larger than that in the transparent region.

In the pixel structure according to an embodiment of the invention, the touch capacitor electrode and an anode of the organic electroluminescent device are provided in the same layer and are made of the same material.

In the pixel structure according to an embodiment of the invention, the touch capacitor electrode is provided on an insulation layer under an anode of the organic electroluminescent device.

According to an embodiment in another aspect of the invention, a transparent touch display screen is provided, and the transparent touch display screen includes a plurality of rows and columns of pixel structures as described above arranged in an array, wherein touch capacitor electrodes provided in two transparent regions of every two adjacent pixel structures in the same row are a first touch capacitor electrode and a second touch capacitor electrode, every two adjacent first touch capacitor electrodes in the same row are electrically connected with each other by a first connection line extending in the row direction, and every two adjacent second touch capacitor electrodes in the same column are electrically connected with each other by a second connection line passing through the display region in the column direction, and the first touch capacitor electrode and the second touch capacitor electrode are provided in different layers to form a touch capacitor.

In the transparent touch display screen according to an embodiment of the invention, the first touch capacitor electrode and a cathode of the organic electroluminescent device are provided in the same layer, disconnected with each other, and made of the same material.

In the transparent touch display screen according to an embodiment of the invention, at least one insulation layer of a plurality of insulation layers under the cathode of the organic electroluminescent device forms a segment difference between the display region and the transparent region.

In the transparent touch display screen according to an embodiment of the invention, the at least one insulation layer includes a passivation layer provided under the anode of the organic electroluminescent device, and a thickness of the passivation layer in the display region is larger than that in the transparent region.

In the transparent touch display screen according to an embodiment of the invention, a photo spacer is provided under the cathode of the organic electroluminescent device in the display region.

In the transparent touch display screen according to an embodiment of the invention, the second touch capacitor electrode and an anode of the organic electroluminescent device are provided in the same layer and are made of the same material.

In the transparent touch display screen according to an embodiment of the invention, the second touch capacitor electrode is provided on an insulation layer under an anode of the organic electroluminescent device.

In the transparent touch display screen according to an embodiment of the invention, a first intermediate dielectric layer is provided between the first connection line and the second touch capacitor electrode; a second intermediate dielectric layer is provided between the first connection line and the first touch capacitor electrode, and the first touch capacitor electrode is electrically connected with the first connection line by a via hole in the second intermediate dielectric layer.

In the transparent touch display screen according to an embodiment of the invention, the second connection line, an anode of the organic electroluminescent device and the second touch capacitor electrode are provided in the same layer and are made of the same material.

In the transparent touch display screen according to an embodiment of the invention, the first intermediate dielectric layer at least includes a first insulation layer, which covers the second touch capacitor electrode in the transparent region, and the first connection line is provided on the first insulation layer: the second intermediate dielectric layer at least includes a pixel defining layer formed in the display region, the pixel defining layer surrounds a pixel opening in the display region, and a via hole is formed in the second intermediate dielectric layer at the transparent region to expose the first connection line.

In the transparent touch display screen according to an embodiment of the invention, the second connection line and the second touch capacitor electrode are provided in the same layer and are made of the same material, and are provided under an anode of the organic electroluminescent device; and the first connection line and the anode of the organic electroluminescent device are provided in the same layer and are made of the same material.

In the transparent touch display screen according to an embodiment of the invention, the second touch capacitor electrode is provided on a passivation layer in the transparent region, the thickness of the passivation layer in the display region is larger than that in the transparent region, the first intermediate dielectric layer at least includes a planarization layer, which covers the display region and the transparent region, and the anode of the organic electroluminescent device is formed on the planarization layer in the display region; the second intermediate dielectric layer at least includes a pixel defining layer in the display region, the pixel defining layer surrounds a pixel opening in the display region, and a via hole is formed in the second intermediate dielectric layer at the transparent region to expose the first connection line.

In the transparent touch display screen according to an embodiment of the invention, the second touch capacitor electrode, the first connection line and the second connection line are made of any one or a combination of indium tin oxide, indium zinc oxide, indium zinc tin oxide, and tin oxide.

According to an embodiment in a further aspect of the invention, a manufacturing method of a transparent touch display screen is provided, and the transparent touch display screen includes a plurality of rows and columns of pixel structures as described above arranged in an array, the manufacturing method includes steps of:

forming a first touch capacitor electrode and a second touch capacitor electrode in different layers of two transparent regions of every two adjacent pixel structures in the same row with a transparent conductive material, respectively; making every two adjacent first touch capacitor electrodes in the same row electrically connected with each other by a first connection line extending in the row direction, and making every two adjacent second touch capacitor electrodes in the same column electrically connected with each other by a second connection line passing through the display region in the column direction.

In the manufacturing method according to an embodiment of the invention, the step of forming a first touch capacitor electrode and a second touch capacitor electrode in different layers of two transparent regions of every two adjacent pixel structures in the same row with a transparent conductive material respectively includes:

forming the second touch capacitor electrode and the second connection line on a substrate by a first patterning process;

forming a first intermediate dielectric layer covering the second touch capacitor electrode and the second connection line;

forming the first connection line on the first intermediate dielectric layer by a second patterning process;

forming a second intermediate dielectric layer covering the first connection line by a third patterning process so that a via hole is formed in the second intermediate dielectric layer to expose the first connection line; and forming the first touch capacitor electrode arranged alternately with the second touch capacitor electrode and a cathode of the organic electroluminescent device located in the display region on the substrate formed with the first connection line by a fourth patterning process so that the first touch capacitor electrode is disconnected with the cathode in the same layer, and the first touch capacitor electrode is electrically connected with the first connection line through the via hole formed in the second intermediate dielectric layer.

In the manufacturing method according to an embodiment of the invention, an anode of the organic electroluminescent device is formed while forming the second touch capacitor electrode and the second connection line on the substrate by the first patterning process.

In the manufacturing method according to an embodiment of the invention, the first intermediate dielectric layer at least includes a first insulation layer, which covers the second touch capacitor electrode in the transparent region, and a part of the first insulation layer in the display region is removed; and the first connection line is provided on the first insulation layer; the second intermediate dielectric layer at least includes the pixel defining layer in the display region, the pixel defining layer surrounds the pixel opening in the display region, and the via hole is formed in the second intermediate dielectric layer in the transparent region to expose the first connection line.

In the manufacturing method according to an embodiment of the invention, after the step of forming the first intermediate dielectric layer covering the second touch capacitor electrode and the second connection line, the manufacturing method further includes forming an anode of the organic electroluminescent device while forming the first connection line on the first intermediate dielectric layer by the second patterning process.

In the manufacturing method according to an embodiment of the invention, before the step of forming the second touch capacitor electrode and the second connection line on a substrate by a first patterning process, the manufacturing method further includes: performing a patterning process on a passivation layer formed on the substrate so that the thickness of the patterned passivation layer in the display region is larger than that in the transparent region;

wherein the step of forming the second touch capacitor electrode and the second connection line on a substrate by a first patterning process includes forming the second touch capacitor electrode and the second connection line on the passivation layer by the first patterning process;

the first intermediate dielectric layer at least includes a planarization layer, which covers the display region and the transparent region; and the anode of the organic electroluminescent device is formed while forming the first connection line on the first intermediate dielectric layer by the second patterning process; and wherein the second intermediate dielectric layer at least includes a pixel defining layer located in the display region, the pixel defining layer surrounds a pixel opening in the display region, and the via hole is formed in the second intermediate dielectric layer at the transparent region to expose the first connection line.

In the manufacturing method according to an embodiment of the invention, the organic electroluminescent device and the first touch capacitor electrode are formed by evaporation.

According to an embodiment in a further aspect of the invention, a display device is provided, and includes the transparent display screen of any one of the above embodiments.

The pixel structure, the transparent touch display screen and the manufacturing method thereof, and the display device including the transparent touch display screen of the present invention use the transparent display region of the OLED, AMOLED display screen to evaporate the cathode and provide the ITO layers to function as the two plates of the in-cell touch sensing capacitor, and thus can achieve the touch display function based on the transparent array substrate without affecting the transmittance.

BRIEF DESCRIPTION OF THE DRAWINGS

In order to make the object, the solutions and the advantages of the invention clearer, the invention will be further described in conjunction with the following embodiments and referring to the drawings. In the drawings.

DETAILED DESCRIPTION OF THE EMBODIMENTS

Solutions of the invention will be described below in detail by the embodiments in conjunction with the accompanying drawings. In the specification, like or similar reference numerals indicate like or similar parts. The following description of the embodiments of the invention by referring to the drawings is intended to interpret the general inventive concept of the invention, and should not be considered to limit the invention.

According to a general inventive concept of the various embodiments of the invention, a transparent touch display screen is provided, and the transparent touch display screen includes a plurality of rows and columns of pixel structures arranged in an array. Each pixel structure includes a display region provided with an organic electroluminescent device, and a transparent region arranged side by side with the display region. Every two adjacent transparent regions in the same row are provided therein with a first touch capacitor electrode and a second touch capacitor electrode which are made of a transparent conductive material, respectively, every two adjacent first touch capacitor electrodes in the same row are electrically connected by a first connection line extending in the row direction, and every two adjacent second touch capacitor electrodes in the same column are electrically connected by a second connection line passing through the display region in the column direction. The first touch capacitor electrode and the second touch capacitor electrode are arranged in different layers to form a touch capacitor.

In the following detailed description, in order to facilitate the explanation, various particular details are elaborated to provide the overall understanding of the disclosed embodiments. However, it is apparent that, one or more embodiments can be implemented without these particular details. In other cases, well known structures and devices are schematically embodied to simply the drawings.

Figure 1:
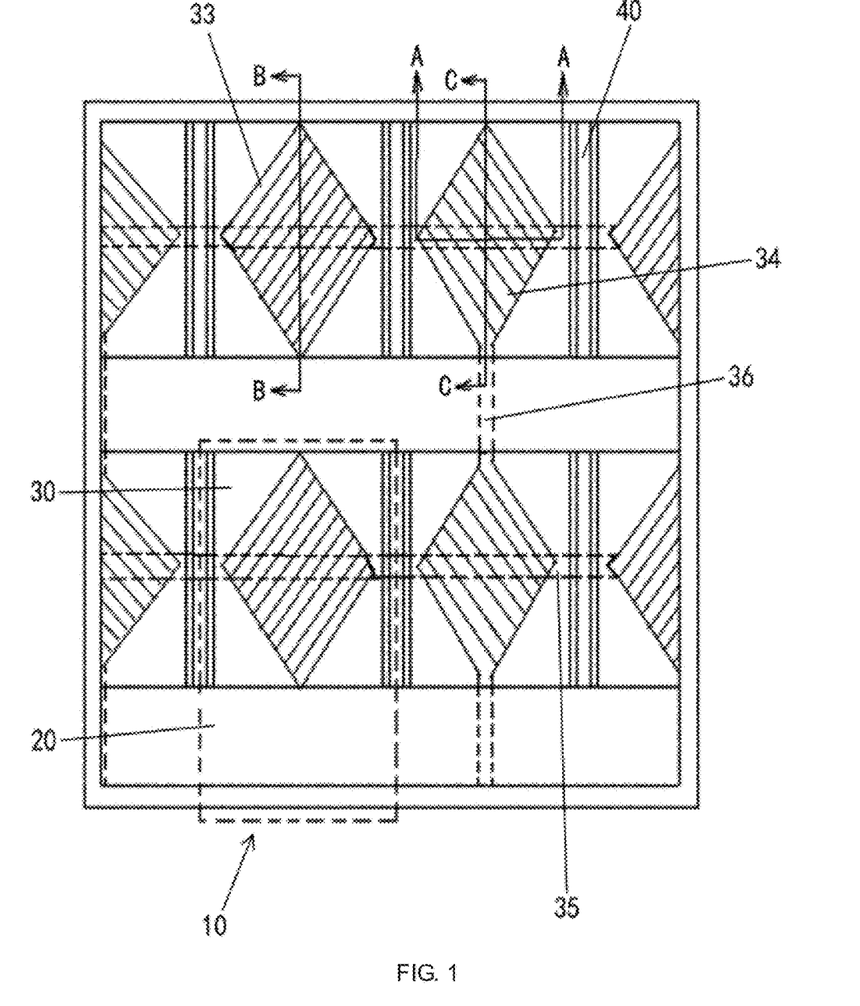
FIG. 1 is a plane schematic view of a transparent touch display screen according to a first embodiment of the invention.
Figure 2:
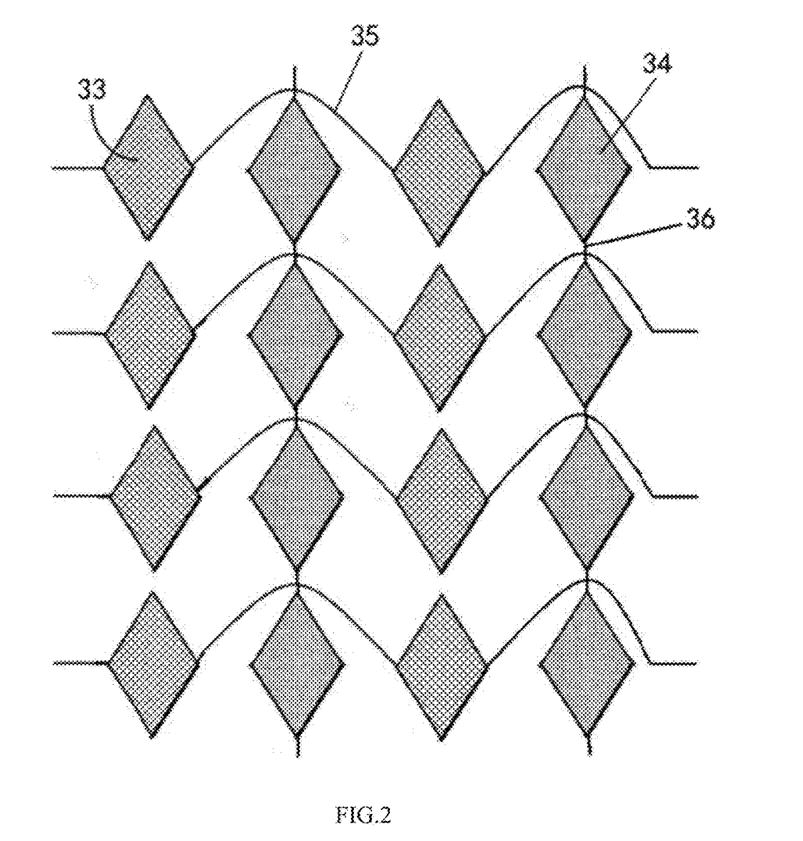
FIG. 2 is a circuit schematic diagram of a touch capacitor of the transparent touch display screen in FIG. 1 according to one embodiment.

FIG. 1 is a plane schematic view of a transparent touch display screen according to a first embodiment of the invention, and FIG. 2 is a circuit schematic diagram of a touch capacitor of the transparent touch display screen in FIG. 1 according to one embodiment. Referring to FIGS. 1 and 2, the transparent touch display screen according to an exemplary embodiment of the invention includes a plurality of rows and columns of pixel structures 10 arranged in an array, and each pixel structure 10 includes a display region 20 and a transparent region 30. The display region 20 includes an organic electroluminescent device (which will be described in detail later); and the transparent region 30 and the display region 20 are arranged side by side. Every two adjacent transparent regions 30 in the same row are provided therein with a first touch capacitor electrode 33 and a second touch capacitor electrode 34 which are made of a transparent conductive material, respectively, every two adjacent first touch capacitor electrodes 33 in the same row are electrically connected by a first connection line 35 extending in the row direction, and every two adjacent second touch capacitor electrodes 34 in the same column are electrically connected by a second connection line 36 passing through the display region 20 in the column direction. The first touch capacitor electrode 33 and the second touch capacitor electrode 34 are arranged in different layers of the transparent regions 30 to form a touch capacitor. In one exemplary embodiment, an isolated cathode formed in the same process for forming a cathode of the organic electroluminescent device functions as the first touch capacitor electrode 33, and the second touch capacitor electrode 34 is formed in a process different from that for the cathode of the organic electroluminescent device. In such a way, the isolated cathode functioning as the first touch capacitor electrode 33 may be formed while the cathode of the organic electroluminescent device is formed (which will be described in detail later), to simply the manufacturing procedure.

In the transparent touch display screen according to the embodiment of the invention, in a pulse period, for example, when a finger touches a display screen, a capacitance of the sensing capacitor is changed, to result in a change in an output voltage of a related circuit, and the touch location can be determined by the change of the output voltage. The detection of the touch location belongs to the prior art, and will not be limited in the invention.

In the transparent touch display screen according to the embodiment of the invention, the organic electroluminescent device may be an organic light emitting diode (OLED) or an active matrix organic light emitting diode (AMOLED). Under a non-working state, the organic electroluminescent device does not emit light, and the transparent region of the transparent touch display screen functions as a transparent plate due to its transparency; under a working state, the organic electroluminescent device emits light according to an external signal to display an image, at this time, the transparent touch display screen functions as a display screen, and at the same time, by arranging the transparent region, an observer can view an object behind the display screen, achieving the integrated transparency and display functions. The particular structure and the working principle of the organic electroluminescent device can be the same as the existing technology, and will not be elaborated herein.

In the transparent touch display screen according to the embodiment of the invention, the first touch capacitor electrode is arranged in one transparent region, and the second touch capacitor electrode is arranged in an adjacent transparent region, and the first and second touch capacitor electrodes form the sensing capacitor of the transparent touch display screen to sense the touch location. In the transparent touch display screen, the transparent region and the display region are arranged side by side, and the in-cell touch structure is integrated into the process for forming the organic electroluminescent device such as AMOLED or OLED, which has no significant effect on the original transmittance of the transparent display screen, and at the same time reduces the thickness of the transparent touch display screen.

Figure 4:
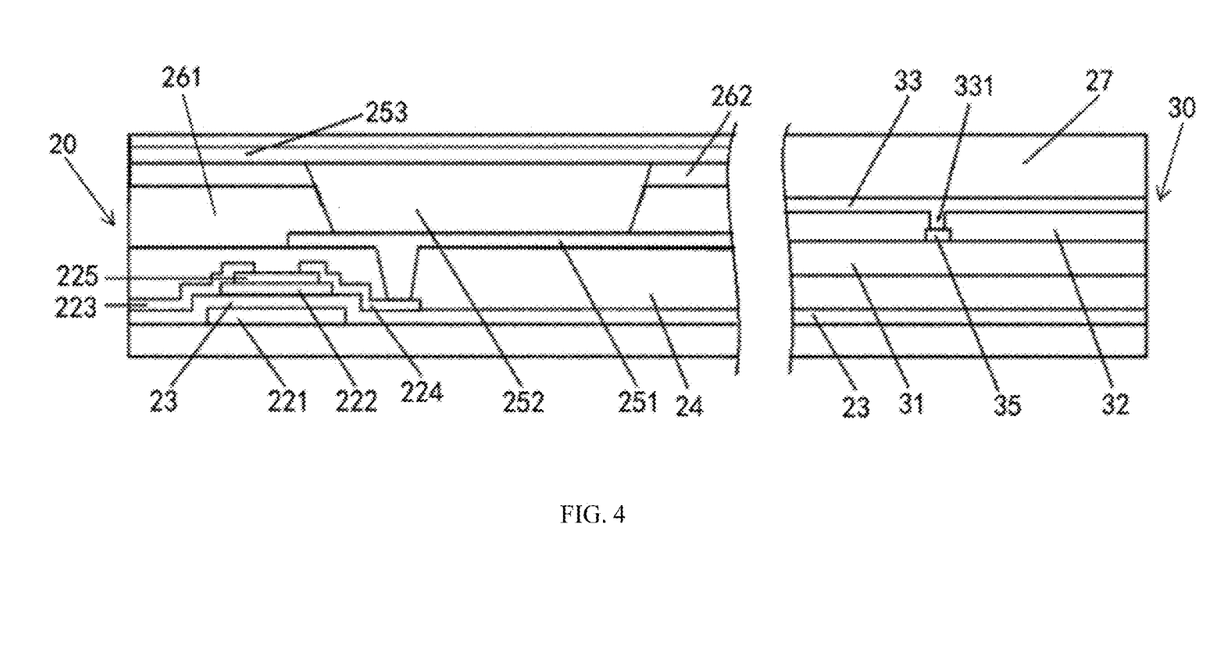
FIG. 4 is a cross-sectional view taken along Line B-B in FIG. 1, illustration a pixel structure having a first touch capacitor electrode according to a first exemplary embodiment.
Figure 5:
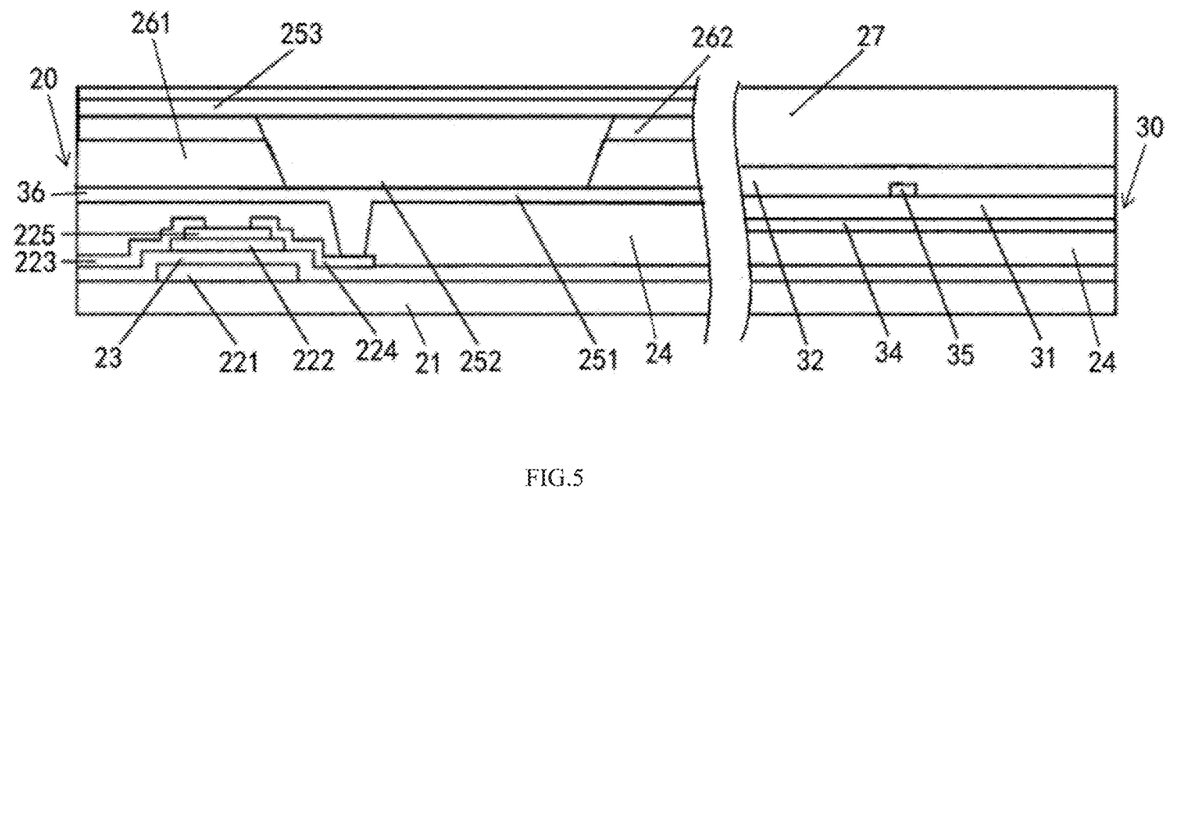
FIG. 5 is a cross-sectional view taken along Line C-C in FIG. 1, illustrating a pixel structure having a second touch capacitor electrode according to a first exemplary embodiment.

In the transparent touch display screen according to the embodiment of the invention, the display region is provided with the organic electroluminescent device. In particular, as shown in FIGS. 4 and 5, the display region 20 includes a substrate 21 which is for example made of glass or a transparent resin material, a thin film transistor formed on the substrate 21, and the organic electroluminescent device driven by the thin film transistor. The thin film transistor includes a gate 221 formed on the substrate 21, a gate insulation layer 23 formed on the gate 221, an active layer 222 formed on the gate insulation layer 23, a source 223 and a drain 224 formed on the active layer 222, and an etching stop layer 225 formed on the active layer 222 and between the source 223 and the drain 224. A passivation layer (PVX) 24 is formed on the gate insulation layer 23 to cover a corresponding portion of the thin film transistor. The organic electroluminescent device includes an anode 251 which is formed on the passivation layer 24 and electrically connected to the drain 224 of the thin film transistor (TFT) through a via hole formed in the passivation layer 24, an organic light emitting layer 252 and a cathode 253. A pixel defining layer (PDL) 261 is provided between the organic electroluminescent devices in the display regions 20 of two adjacent pixel structures 10, and surrounds pixel openings in the display regions 20 to form a plurality of sub-pixel units. Optionally, a planarization layer (PLN, not shown in the figure) is formed on the passivation layer 24 to increase the flatness of the anode 251.

In one exemplary embodiment, a photo spacer (PS) 262 is provided on the pixel defining layer 261 below the cathode 253 to increase the segment difference between the display region 20 and the transparent region 30, so that the isolated cathode of the transparent region 30 (i.e. the first touch capacitor electrode 33) is completely disconnected with the evaporated cathode 253 of the organic electroluminescent device in the display region 20.

It should be understood that, there are a plurality of insulation layers provided in the display region 20, including the gate insulation layer 23, the passivation layer 24, the pixel defining layer 261, and the like, and these insulation layers may be made of silicon oxide (SiOx) and/or silicon nitride (SiNx). Each of these insulation layers may extend into the transparent region 30 in the same layer.

In one exemplary embodiment, the first touch capacitor electrode 33 and the cathode 253 of the organic electroluminescent device are disconnected with each other in the same layer, and are made of the same material. In such a way, the first touch capacitor electrode 33 and the cathode 253 of the organic electroluminescent device may be formed by a single patterning process with the same mask plate to simply the manufacturing procedure. Since the first touch capacitor electrode 33 and the cathode 253 of the organic electroluminescent device are disconnected with each other, the first touch capacitor electrode 33 may be formed to be an isolated cathode. In the transparent touch display screen according to the embodiment of the invention, the in-cell touch structure is integrated into the process for forming the organic electroluminescent device, which has no significant effect on the original transmittance of the transparent display screen, and at the same time reduces the thickness of the transparent touch display screen.

According to the embodiment of the invention, the second touch capacitor electrode 34, the first connection line 35 and the second connection line 36 are all made of indium tin oxide (ITO), and the invention is not limited thereto. For example, the second touch capacitor electrode 34, the first connection line 35 and the second connection line 36 may be made of any one or a combination of transparent conductive materials such as indium zinc oxide (IZO), indium zinc tin oxide (ITZO), and tin oxide (TO).

As shown in FIG. 1, a data line 40 is provided between every two adjacent pixel structures to be connected to the cathode or the anode of the display region 20, to control brightness of a corresponding organic electroluminescent device based on a video signal transmitted from outside.

In one embodiment, at least one insulation layer of the plurality of insulation layers below the cathode 253 of the organic electroluminescent device is formed so that a segment difference exists between the display region 20 and the transparent region 30. For example, as shown in FIGS. 4 and 5, the at least one insulation layer includes the passivation layer 24 provided below the anode 251 of the organic electroluminescent device, and the thickness of the passivation layer 24 in the display region 20 is larger than that in the transparent region 30, so that a segment difference exists between the display region 20 and the transparent region 30 at the passivation layer 24 in the thickness direction. As shown in FIG. 4, due to the segment difference, it is convenient to make the first touch capacitor electrode 33 disconnected with the cathode 253 of the organic electroluminescent device when the first touch capacitor electrode 33 and the cathode 253 are formed by a single patterning process with the same mask plate, and thus the first touch capacitor electrode 33 refers to as the isolated cathode.

In one embodiment, as shown in FIGS. 4 and 5, the spacer 262 is provided below the cathode 253 of the organic electroluminescent device in the display region 20 to increase the segment difference between the display region 20 and the transparent region 30.

In one embodiment, as shown in FIG. 5, the second touch capacitor electrode 34 and the anode 251 of the organic electroluminescent device are provided in the same layer and are made of the same material. In such a way, the second touch capacitor electrode 34 and the anode 251 of the organic electroluminescent device may be formed by a single patterning process with the same mask plate to simply the manufacturing procedure. In an alternative embodiment, the second touch capacitor electrode 34 is provided on an insulation layer below the anode 251 of the organic electroluminescent device. For example, the second touch capacitor electrode 34 is provided on the gate insulation layer 23 below the anode 251 of the organic electroluminescent device; alternatively, in the case that a planarization layer (not shown) is provided between the passivation layer 24 and the anode 251, the second touch capacitor electrode 34 may be provided on the passivation layer 24.

In one embodiment, as shown in FIG. 5, a first intermediate dielectric layer (ILD) 31 made of silicon oxide (SiOx) or silicon nitride (SiNx) is provided between the first connection line 35 and the second touch capacitor electrode 34; as shown in FIG. 4, a second intermediate dielectric layer 32 is provided between the first connection line 35 and the first touch capacitor electrode 33 formed by the isolated cathode, and the first touch capacitor electrode 33 is electrically connected to the first connection line 35 by a via hole 331 in the second intermediate dielectric layer 32.

In one embodiment, as shown in FIG. 5, the second connection line 36, the anode 251 of the organic electroluminescent device and the second touch capacitor electrode 34 are provided in the same layer and made of the same material. In such a way, the second connection line 36, the anode 251 of the organic electroluminescent device and the second touch capacitor electrode 34 are formed by a single patterning process with the same mask plate to simply the manufacturing procedure.

In one embodiment, as shown in FIGS. 4 and 5, the first intermediate dielectric layer 31 at least includes a first insulation layer, which covers the second touch capacitor electrode 34 in the transparent region 30; the first connection line 35 is provided on the first insulation layer, the second intermediate dielectric layer 32 at least includes the pixel defining layer 261 formed in the display region 20, the pixel defining layer 261 surrounds a pixel opening in the display region 20, and a via hole 331 is formed in the second intermediate dielectric layer 32 at the transparent region 30 to expose the first connection line 35. In such a way, the pixel defining layer 261 and the second intermediate dielectric layer 32 are formed by a single patterning process with the same material, to simply the manufacturing procedure.

Figure 3:
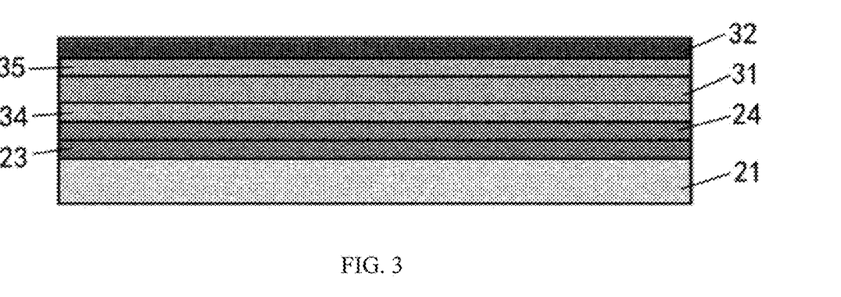
FIG. 3 is a cross-sectional view taken along Line A-A in FIG. 1, illustrating a pixel structure having a second touch capacitor electrode according to a first exemplary embodiment.

FIG. 3 is a cross-sectional view taken along Line A-A in FIG. 1, illustrating a pixel structure having a second touch capacitor electrode according to a first exemplary embodiment. As shown in FIG. 3, in the cross-sectional view of one pixel structure having the second touch capacitor electrode taken along the row direction, the substrate 21, the gate insulation layer 23, the passivation layer 24, the second touch capacitor electrode 34, the first intermediate dielectric layer 31 the first connection line 35 and the second intermediate dielectric layer 32 (i.e. the part of the pixel defining layer 261 which extends to the transparent region 20) are sequentially provided from bottom to top in the thickness direction. In addition, a protection layer 27 (not shown in FIG. 3) is provided at the uppermost layer to cover the display region 20 and the transparent region 30.

Figure 6:
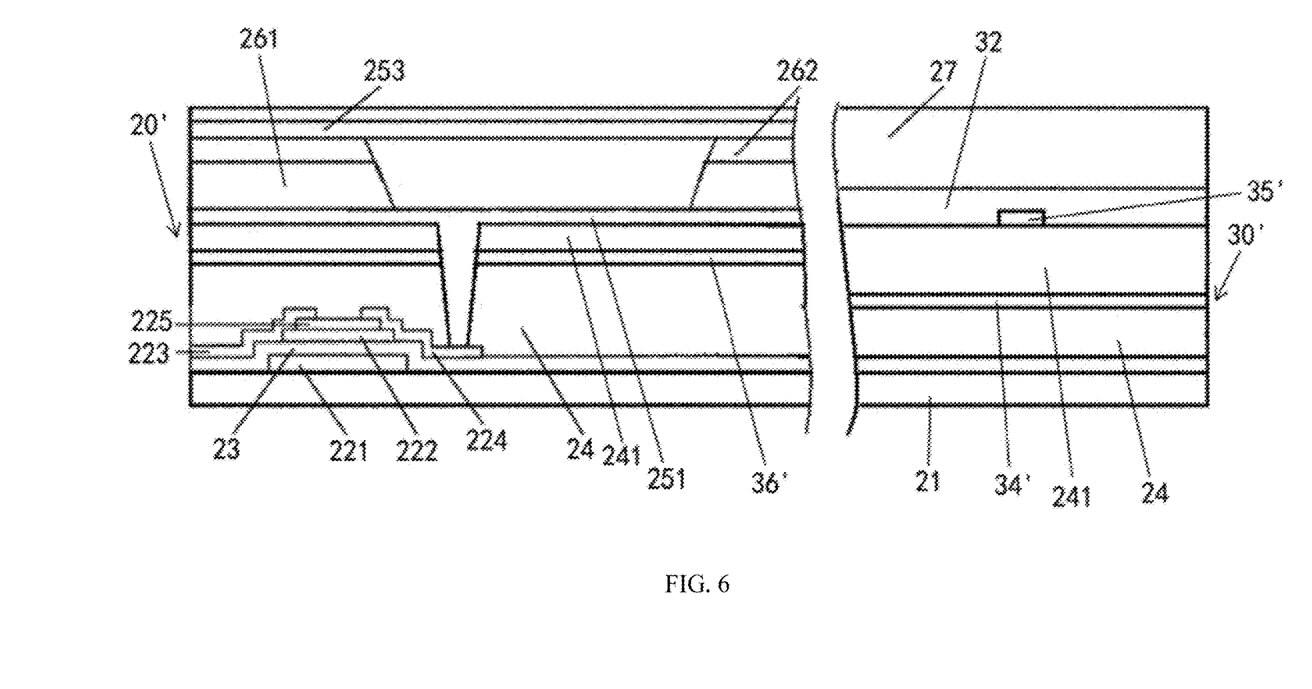
FIG. 6 is a cross-sectional view taken along Line C-C in FIG. 1, illustrating a pixel structure having a second touch capacitor electrode according to a second exemplary embodiment.

FIG. 6 is a cross-sectional view taken along Line C-C in FIG. 1, illustrating a pixel structure having a second touch capacitor electrode according to a second exemplary embodiment. Like parts in the pixel structure according to the second exemplary embodiment shown in FIG. 6 are labeled with the same reference numerals as in the pixel structure according to the first embodiment.

Referring to FIG. 6, in one embodiment, the second connection line 36' and the second touch capacitor electrode 34' are provided in the same layer and made of the same material, and are provided under the anode 251 of the organic electroluminescent device; the first connection line 35' and the anode 251 of the organic electroluminescent device are provided in the same layer, and are made of the same material. In such a way, the second connection line 36' and the second touch capacitor electrode 34' are formed by a single patterning process with the same mask plate, and the first connection line 35' and the anode 251 of the organic electroluminescent device are formed by a single patterning process with the same mask plate, so as to simply the manufacturing procedure.

In a further embodiment, the second touch capacitor electrode 34' is provided on the passivation layer 24 in the transparent region 30', the thickness of the passivation layer 24 in the display region 20' is larger than that in the transparent region 30', the first intermediate dielectric layer at least includes the planarization layer 241, which covers the display region 20' and the transparent region 30', and the anode 251 of the organic electroluminescent device is formed on the planarization layer 241 in the display region 20'; the second intermediate dielectric layer at least includes the pixel defining layer 261 in the display region 20', the pixel defining layer 261 surrounds a pixel opening in the display region 20', and a via hole is formed (not shown in FIG. 6) in the second intermediate dielectric layer at the transparent region to expose the first connection line 35'. In such a way, the first connection line 35' and the first touch capacitor electrode (not shown in FIG. 6) are electrically connected to each other through the via hole.

In the transparent touch display screen according to the second embodiment, the first connection line 35' and the anode 251 of the organic electroluminescent device are provided in the same layer and are made of the same material, and can be formed by another single patterning process with another mask plate, to simply the manufacturing procedure.

In the above embodiment, the second touch capacitor electrode, the first connection line and the second connection line may be made of any one or a combination of transparent conductive materials such as indium tin oxide, indium zinc oxide, indium zinc tin oxide, and tin oxide. These conductive layers are provided in the transparent region, and in the case that the display region does not operate, these conductive layers will not prevent light rays from passing through the transparent region, so that the transparent touch display screen of the invention functions as a transparent apparatus.

It should be understood from the above embodiment that, in the transparent touch display screen according to the embodiment of the invention, the structure and manufacturing procedure of the conventional display region are basically not changed, and some function layers in the transparent region can be formed in the same processes as for the corresponding function layers in the display region, such as the substrate, the gate insulation layer, the passivation layer, the pixel defining layer and the like, so as to simply the manufacturing procedure.

It should be understood by a person skilled in the art that, in the transparent touch display screen according to the embodiment of the invention, the transparent region maintains the transparent function, and besides this, the transparent region is provided therein with the first and second touch capacitor electrodes for forming the touch sensing capacitor. In an alternative embodiment, in the transparent region, the transition layers such as the passivation layer (PVX) and the planarization layer (PLN) of the conventional OLED or AMOLED display screen may be omitted, so as to further simply the manufacturing procedure. Without the transition layers, a larger segment difference, for example, about 3.7 μm, may exist between the display region and the transparent region. The evaporated cathode has a smaller thickness, for example smaller than 150A, and thus the cathode cannot cover the transition part between the display region and the transparent region, so that the cathode of the transparent region is disconnected with the cathode of the organic electroluminescent device in the display region, so as to form an isolated cathode in the transparent region. The isolated cathode separately provided in the transparent region functions as the first touch capacitor electrode of the sensing capacitor.

In another embodiment, an organic layer (not shown) formed in the same process for the organic light emitting layer of the light emitting part is further provided between the second intermediate dielectric layer and the first touch capacitor electrode formed by the isolated cathode. In such a way, the isolated cathode and the organic layer formed together with the cathode and the organic light emitting layer of the light emitting part still maintain in the transparent region provided with the first touch capacitor electrode, to simply the manufacture process for forming the first touch capacitor electrode.

In one exemplary embodiment, in the transparent region where the second touch capacitor electrode is located, the isolated region and the organic layer corresponding to the cathode and the organic light emitting layer of the light emitting part may not be provided. However, the invention is not limited thereto. The isolated region and the organic layer corresponding to the cathode and the organic light emitting layer of the light emitting part may be still provided in the transparent region where the second touch capacitor electrode is located. It should be understood that, the second touch capacitor electrode may be provided on any insulation layer under the first touch capacitor electrode and is electrically insulated from the first touch capacitor electrode.

In another exemplary embodiment, both the first touch capacitor electrode and the second touch capacitor electrode are made of the material such as indium tin oxide in a step different from that for making the cathode of the light emitting part. That is, in one embodiment, parts corresponding to the cathode and the organic light emitting layer of the light emitting part may no longer be provided in the transparent region, and the first touch capacitor electrode and the second touch capacitor electrode may be formed in a separate process.

In an embodiment according to another aspect of the invention, a pixel structure 10 is provided, and the pixel structure includes a display region 20 and a transparent region 30, wherein the display region 20 includes an organic electroluminescent device, the transparent region 30 and the display region 20 are provided side by side, and the transparent region 30 is provided therein with a touch capacitor electrode which is made of a transparent conductive material. In such a way, the transparent region may have a touch sensing function.

In one embodiment, the touch capacitor electrode is disconnected with the cathode 253 of the organic electroluminescent device in the same layer, and the touch capacitor electrode and the cathode 253 of the organic electroluminescent device are made of the same material. In such a way, the touch capacitor electrode and the cathode 253 of the organic electroluminescent device are formed by a single patterning process with the same mask plate, so as to simply the manufacturing procedure. Since the touch capacitor electrode is disconnected with the cathode of the organic electroluminescent device, the touch capacitor electrode may be formed to be an isolated cathode. The pixel structure according to the embodiment of the invention may form a transparent touch display screen, and the in-cell touch structure is integrated into the process for forming the organic electroluminescent device, which has no significant effect on the original transmittance of the transparent display screen, and at the same time reduces the thickness of the transparent touch display screen.

In one embodiment, at least one insulation layer of a plurality of insulation layers under the cathode 253 of the organic electroluminescent device is formed so that a segment difference exists between the display region 20 and the transparent region 30. In particular, the at least one insulation layer includes the passivation layer 24 provided under the anode 251 of the organic electroluminescent device, and the thickness of the passivation layer 24 in the display region 20 is larger than that in the transparent region 30, so that the segment difference exists between the display region 20 and the transparent region 30 at the passivation layer in the thickness direction. As shown in FIG. 4, due to the segment difference, it is convenient to make the touch capacitor electrode disconnected with the cathode 253 of the organic electroluminescent device when the touch capacitor electrode and the cathode 253 are formed by a single patterning process with the same mask plate, and thus the touch capacitor electrode 33 refers to as the isolated cathode.

Further, the touch capacitor electrode and the anode 251 of the organic electroluminescent device are provided in the same layer and are made of the same material. In such a way, the touch capacitor electrode and the anode 251 of the organic electroluminescent device are formed by a single patterning process with the same mask plate, so as to simplify the manufacturing procedure. In an alternative embodiment, the touch capacitor electrode is provided on an insulation layer under the anode 251 of the organic electroluminescent device. For example, the touch capacitor electrode is provided on the gate insulation layer 23 under the anode 251 of the organic electroluminescent device; alternatively, in the case that a planarization layer (not shown) is provided between the passivation layer 24 and the anode 251, the touch capacitor electrode may be provided on the passivation layer 24.

In an embodiment according to another aspect of the invention, a manufacturing method of a transparent touch display screen is provided, the transparent touch display screen includes a plurality of rows and columns of pixel structures 10 arranged in an array, and each pixel structure 10 includes a display region 20 provided therein with an organic electroluminescent device; and a transparent region 30 provided side by side with the display region 20. The manufacturing method in the embodiment of the invention includes steps of: forming the first touch capacitor electrode 33 and the second touch capacitor electrode 34 in different layers of every two adjacent transparent regions 30 in the same row with a transparent conductive material, respectively; making every two adjacent first touch capacitor electrodes 33 in the same row electrically connected with each other by the first connection line 35 extending in the row direction, and making every two adjacent second touch capacitor electrodes 34 in the same column electrically connected with each other by the second connection line 36 passing through the display region 20 in the column direction.

In the manufacturing method of the transparent touch display screen according to the embodiment of the invention, the first touch capacitor electrode is provided in one transparent region, and the second touch capacitor electrode is provided in another adjacent transparent region, so that the sensing capacitor of the transparent touch display screen is formed by the first touch capacitor electrode and the second touch capacitor electrode, to sense the touch location. In the transparent touch display screen, the in-cell touch structure is integrated into the process for forming the organic electroluminescent device such as AMOLED or OLED, which has no significant effect on the original transmittance of the transparent display screen, and at the same time reduces the thickness of the transparent touch display screen.

In the manufacturing method according to an embodiment of the invention, referring to FIGS. 3 to 5, the step of forming the first touch capacitor electrode 33 and the second touch capacitor electrode 34 in different layers of every two adjacent transparent regions in the same row with a transparent conductive material respectively includes: forming the second touch capacitor electrode 34 and the second connection line 36 on the substrate 21 by a first patterning process; forming the first intermediate dielectric layer 31 covering the second touch capacitor electrode 34 and the second connection line 36; forming the first connection line 35 on the first intermediate dielectric layer 31 by a second patterning process; forming the second intermediate dielectric layer 32 covering the first connection line 35 by a third patterning process so that the via hole 331 is formed in the second intermediate dielectric layer 32 to expose the first connection line 35; and forming the first touch capacitor electrode 33 arranged alternately with the second touch capacitor electrode 34 and the cathode 253 of the organic electroluminescent device located in the display region on the substrate 21 formed with the first connection line 35 by a fourth patterning process so that the first touch capacitor electrode 33 is disconnected with the cathode 253 in the same layer, and the first touch capacitor electrode 33 is electrically connected to the first connection line 35 through the via hole 331 formed in the second intermediate dielectric layer 32. Generally, the patterning process in the embodiment of the invention mainly includes, but not limited thereto, substrate cleaning, film forming, photoresist applying, exposure, development, etching, photoresist peeling and the like.

From the above embodiments, it should be understood that, the manufacturing method of the transparent touch display screen according to the embodiments of the invention does not essentially change the manufacturing procedure of the conventional display region, and some functional layers in the transparent region may be formed in the same processes as for the corresponding functional layers in the display region, such as the substrate, the gate insulation layer, the passivation layer, the pixel defining layer and the like, to simply the manufacturing procedure.

In the manufacturing method according to one embodiment of the invention, the anode 251 of the organic electroluminescent device is formed while the second touch capacitor electrode 34 and the second connection line 36 are formed by the first patterning process on the substrate 21. In such a way, the second connection line 36, the second touch capacitor electrode 34 and the anode 251 of the organic electroluminescent device may be formed by a single patterning process with the same mask plate, to simply the manufacturing procedure.

In one embodiment, as shown in FIGS. 4 and 5, the first intermediate dielectric layer 31 at least includes the first insulation layer, which covers the second touch capacitor electrode 34 in the transparent region, a part of the first insulation layer in the display region is removed, and the first connection line 35 is provided on the first insulation layer; the second intermediate dielectric layer 32 at least includes the pixel defining layer 261, the pixel defining layer 261 surrounds the pixel opening in the display region 20, and the via hole 331 is formed in the second intermediate dielectric layer 32 in the transparent region 30 to expose the first connection line 35. In such a way, the pixel defining layer 261 and the second intermediate dielectric layer 32 are formed by a single patterning process with the same material, to simply the manufacturing procedure.

In an embodiment, as shown in FIG. 6, after the step of forming the first intermediate dielectric layer 31 covering the second touch capacitor electrode 34' and the second connection line 36', the anode 251 of the organic electroluminescent device is formed while the first connection line 35' is formed on the first intermediate dielectric layer 31 by the second patterning process. In such a way, the second connection line 36' and the second touch capacitor electrode 34' are formed by a single patterning process with the same mask plate, and the anode 251 of the organic electroluminescent device and the first connection line 35' are formed by another single patterning process with another mask plate, to simply the manufacturing procedure.

In an embodiment, as shown in FIG. 6, before the step of forming the second touch capacitor electrode 34' and the second connection line 36' on the substrate 21 by the first patterning process, the manufacturing method further includes: performing a patterning process on the passivation layer 24 so that the thickness of the patterned passivation layer 24 in the display region 20' is larger than that in the transparent region 30'; forming the second touch capacitor electrode 34' and the second connection line 36' on the passivation layer 24; forming the first intermediate dielectric layer 31 on the second touch capacitor electrode 34' and the second connection line 36' so that the first intermediate dielectric layer 31 at least includes the planarization layer 241, which covers the display region 20' and the transparent region 30'; and forming the anode 251 of the organic electroluminescent device while forming the first connection line 35' on the first intermediate dielectric layer 31 by the second patterning process. The second intermediate dielectric layer 32 at least includes the pixel defining layer 261 located in the display region 20', the pixel defining layer 261 surrounds the pixel opening in the display region 20', and the via hole 331' is formed in the second intermediate dielectric layer 32 in the transparent region 30' to expose the first connection line 35' (not shown in FIG. 6).

In an embodiment, the organic electroluminescent device and the first touch capacitor electrode are formed by evaporation. Since there is a segment difference between the display region and the transparent region, the cathode cannot cover the display region and the transparent region, and thus the cathode in the transparent region is disconnected with the cathode of the organic electroluminescent device, to form an isolated cathode.

In an embodiment, both the first touch capacitor electrode and the second touch capacitor electrode are made of ITO. In an alternative embodiment, the first touch capacitor electrode and the second touch capacitor electrode may be also made of a transparent conductive material such as indium zinc oxide (IZO), indium zinc tin oxide (ITZO), and tin oxide (TO).

It should be pointed out that, although the above descriptions do not relate to the manufacturing procedure for the light emitting part, it should be understood that, during the course of performing the above various steps, the steps for forming corresponding portions of the light emitting part are also included, and the in-cell touch manufacturing procedure is integrated into the procedure for forming the array substrate, to achieve the better combination of the OLED transparent display function and the in-cell touch function. Since the steps for forming the light emitting part are the same as those in the prior art, the detailed descriptions thereof will be omitted in the invention. In addition, it should be understood that, after forming isolated cathodes of the plurality of transparent regions, the planarization layer or the buffering layer may be provided as desired, and another glass substrate is finally mounted.

In an exemplary embodiment, before forming the isolated cathode functioning as the first touch capacitor electrode in the transparent region, a photo spacer (PS) is formed in the display region and the cathode of the light emitting device is evaporated on the photo spacer, thus the isolated cathode in the transparent region and the evaporated cathode of the light emitting device in the display region are completely disconnected with each other.

According to a further embodiment, the invention provides a display device, which includes the transparent touch display screen according to any one of the above embodiments. The display device may be any product or component with display function such as a mobile phone, a tablet computer, a TV, a display, a notebook computer, a digital image frame, a navigator and an electric paper. The display device may be a transparent display panel mounted on the door, on the wall, on the worktable, and all kinds of household appliances.

The pixel structure, the transparent touch display screen and the manufacturing method thereof, and the display device including the transparent touch display screen according to the above embodiment of the invention use the transparent display region of the OLED, AMOLED display screen to evaporate the cathode and provide the ITO layers to function as the two plates of the in-cell touch sensing capacitor, thus achieving the touch sensing function. In such a way, based on the transparent array substrate, the transparent touch display screen according to the embodiment of the invention can achieve the touch display function and reduce the thickness of the entire display device without affecting the transmittance.

Further, in the transparent touch display screen and the display device according to the embodiment of the invention, the touch sensing layer is formed in the transparent region, the passivation layer (PVX) and the planarization layer (PLN) in the transparent region of the conventional OLED or AMOLED display screen may be omitted, so as to simply the manufacturing procedure.

In the above particular embodiments, the object, the technical solutions and the advantageous effects of the invention are described in detail, and it should be understood that, the above embodiments are only exemplary embodiments and are not intended to limit the invention, and all variations and improvements made within the spirit and the principle of the invention should fall into the protection scope of the present invention.

What is claimed is:

1. A pixel structure, including:
   a display region, including an organic electroluminescent device above a substrate; and
   a transparent region, provided side by side with the display region, and provided with a touch capacitor electrode above the substrate, which is made of a transparent conductive material,
   wherein a height difference between the display region and the transparent region is caused by at least one insulation layer of a plurality of insulation layers under a cathode of the organic electroluminescent device; and
   the touch capacitor electrode and the cathode of the organic electroluminescent device are provided in the transparent region and the display region, respectively, and made of two different parts of a same layer, respectively, and the two different parts are provided at different heights from the substrate and disconnected from each other due to the height difference.

2. The pixel structure of claim 1, wherein the at least one insulation layer includes a passivation layer provided under the cathode of the organic electroluminescent device, and a thickness of the passivation layer in the display region is larger than that in the transparent region.

3. A transparent touch display screen including a plurality of rows and columns of pixel structures of claim 1 arranged in an array,
   wherein, every two adjacent columns of pixel structures constitute one group, a touch capacitor electrode provided in the transparent region of each in a previous column of pixel structures of the one group is a first touch capacitor electrode, and a touch capacitor electrode provided in the transparent region of each in a latter column of pixel structures of the one group is a second touch capacitor electrode, every two adjacent first touch capacitor electrodes in the same row are electrically connected with each other by a first connection line extending in the row direction, and every two adjacent second touch capacitor electrodes in the same column are electrically connected with each other by a second connection line passing through the display region in the column direction, and
   the first touch capacitor electrode and the second touch capacitor electrode are provided in different layers to form a touch capacitor.

4. The transparent touch display screen of claim 3, wherein the at least one insulation layer includes a passivation layer provided under the cathode of the organic electroluminescent device, and a thickness of the passivation layer in the display region is larger than that in the transparent region.

5. The transparent touch display screen of claim 3, wherein a photo spacer is provided under the cathode of the organic electroluminescent device in the display region.

6. The transparent touch display screen of claim 3, wherein the second touch capacitor electrode and an anode of the organic electroluminescent device are provided in the same layer and are made of the same material.

7. The transparent touch display screen of claim 3, wherein a first intermediate dielectric layer is provided between the first connection line and the second touch capacitor electrode; a second intermediate dielectric layer is provided between the first connection line and the first touch capacitor electrode, and the first touch capacitor electrode is electrically connected with the first connection line by a via hole in the second intermediate dielectric layer.

8. The transparent touch display screen of claim 7, wherein the second connection line, an anode of the organic electroluminescent device and the second touch capacitor electrode are provided in the same layer and are made of the same material.

9. The transparent touch display screen of claim 8, wherein the first intermediate dielectric layer at least includes a first insulation layer, which covers the second touch capacitor electrode in the transparent region, and the first connection line is provided on the first insulation layer; the second intermediate dielectric layer at least includes a pixel defining layer formed in the display region, the pixel defining layer surrounds a pixel opening in the display region, and a via hole is formed in the second intermediate dielectric layer at the transparent region to expose the first connection line.

10. The transparent touch display screen of claim 7, wherein the second connection line and the second touch capacitor electrode are provided in the same layer and are made of the same material, and are provided under an anode of the organic electroluminescent device; and the first connection line and the anode of the organic electroluminescent device are provided in the same layer and are made of the same material.

11. The transparent touch display screen of claim 10, wherein the second touch capacitor electrode is provided on a passivation layer in the transparent region, the thickness of the passivation layer in the display region is larger than that in the transparent region, the first intermediate dielectric layer at least includes a planarization layer, which covers the display region and the transparent region, and the anode of the organic electroluminescent device is formed on the planarization layer in the display region; the second intermediate dielectric layer at least includes a pixel defining layer in the display region, the pixel defining layer surrounds a pixel opening in the display region, and a via hole is formed in the second intermediate dielectric layer at the transparent region to expose the first connection line.

12. A manufacturing method of a transparent touch display screen, which includes a plurality of rows and columns of pixel structures of claim 1 arranged in an array, the manufacturing method includes steps of:
forming a first touch capacitor electrode and a second touch capacitor electrode in different layers of two transparent regions of every two adjacent pixel structures in the same row with a transparent conductive material, respectively; making every two adjacent first touch capacitor electrodes in the same row electrically connected with each other by a first connection line extending in the row direction, and making every two adjacent second touch capacitor electrodes in the same column electrically connected with each other by a second connection line passing through the display region in the column direction.

13. The manufacturing method of claim 12, wherein the step of forming a first touch capacitor electrode and a second touch capacitor electrode in different layers of two transparent regions of every two adjacent pixel structures in the same row with a transparent conductive material respectively includes:
forming the second touch capacitor electrode and the second connection line on a substrate by a first patterning process;
forming a first intermediate dielectric layer covering the second touch capacitor electrode and the second connection line;
forming the first connection line on the first intermediate dielectric layer by a second patterning process;
forming a second intermediate dielectric layer covering the first connection line by a third patterning process so that a via hole is formed in the second intermediate dielectric layer to expose the first connection line; and
forming the first touch capacitor electrode arranged alternately with the second touch capacitor electrode and a cathode of the organic electroluminescent device located in the display region on the substrate formed with the first connection line by a fourth patterning process so that the first touch capacitor electrode is disconnected from the cathode in the same layer, and the first touch capacitor electrode is electrically connected with the first connection line through the via hole formed in the second intermediate dielectric layer.

14. The pixel structure of claim 1, wherein the at least one insulation layer includes a passivation layer which is only provided under the cathode of the organic electroluminescent device.

15. A pixel structure, including:
a display region, including an organic electroluminescent device above a substrate; and
a transparent region, provided side by side with the display region, and provided with a touch capacitor electrode above the substrate, which is made of a transparent conductive material,
wherein a height difference between the display region and the transparent region is caused by at least one insulation layer of a plurality of insulation layers under an anode the organic electroluminescent device, wherein the touch capacitor electrode and the anode of the organic electroluminescent device are provided in the transparent region and the display region, respectively, and made of two different parts of a same layer, respectively, and the two different parts are provided at different heights from the substrate and disconnected from each other due to the height difference.

16. The pixel structure of claim 15, wherein the at least one insulation layer includes a passivation layer provided under the anode of the organic electroluminescent device, and a thickness of the passivation layer in the display region is larger than that in the transparent region.

17. The pixel structure of claim 15, wherein the at least one insulation layer includes a passivation layer which is only provided under the anode of the organic electroluminescent device.

18. A transparent touch display screen including a plurality of rows and columns of pixel structures of claim 15 arranged in an array,
wherein, every two adjacent columns of pixel structures constitute one group, a touch capacitor electrode provided in the transparent region of each in a previous column of pixel structures of the one group is a first touch capacitor electrode, and a touch capacitor electrode provided in the transparent region of each in a latter column of pixel structures of the one group is a second touch capacitor electrode, every two adjacent first touch capacitor electrodes in the same row are electrically connected with each other by a first connection line extending in the row direction, and every two adjacent second touch capacitor electrodes in the same column are electrically connected with each other by a second connection line passing through the display region in the column direction, and the first touch capacitor electrode and the second touch capacitor electrode are provided in different layers to form a touch capacitor.

19. The transparent touch display screen of claim 18, wherein the at least one insulation layer includes a passivation layer provided under the anode of the organic electroluminescent device, and a thickness of the passivation layer in the display region is larger than that in the transparent region.

* * * * *